US008625302B2

(12) United States Patent
Chu et al.

(10) Patent No.: US 8,625,302 B2
(45) Date of Patent: Jan. 7, 2014

(54) ELECTRONIC DEVICE AND PORT CONNECTOR THEREOF

(75) Inventors: Yung-Hung Chu, Tu-Cheng (TW); Fu-Fa Le, Shenzhen (CN); Song-Ling Yang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 354 days.

(21) Appl. No.: 13/011,861

(22) Filed: Jan. 22, 2011

(65) Prior Publication Data

US 2012/0147569 A1 Jun. 14, 2012

(30) Foreign Application Priority Data

Dec. 13, 2010 (CN) .......................... 2010 1 0584935

(51) Int. Cl.
*H05K 7/14* (2006.01)

(52) U.S. Cl.
USPC ...... 361/801; 361/679.41; 361/791; 361/772; 439/495; 439/500; 439/881

(58) Field of Classification Search
USPC ........... 361/791, 772; 439/881, 495, 500, 536
See application file for complete search history.

(56) References Cited

U.S. PATENT DOCUMENTS

| | | | | |
|---|---|---|---|---|
| 5,648,712 | A * | 7/1997 | Hahn | 320/111 |
| 5,770,330 | A * | 6/1998 | Castaneda et al. | 429/123 |
| 6,461,764 | B1 * | 10/2002 | Nakamura | 429/170 |

* cited by examiner

*Primary Examiner* — Tuan T Dinh
*Assistant Examiner* — Steven T Sawyer
(74) *Attorney, Agent, or Firm* — Altis Law Group, Inc.

(57) ABSTRACT

An electronic device includes a main body and a port connector. The main body includes a printed circuit board, a bottom plate and a side plate cooperatively defining a opening. The printed circuit board is fixed parallelly to the bottom plate. The port connector includes an outer angled plate having a first wall, a second wall, and first pins and second pins. The first wall is attached to the bottom plate and defines first ports. The second wall is attached to the side plate and defines second ports. Each of the first pins is retained within one of the first ports and contacting the printed circuit board. Each of the second pins is retained within one of the second ports and contacting the printed circuit board.

11 Claims, 6 Drawing Sheets

ELECTRONIC DEVICE AND PORT CONNECTOR THEREOF

BACKGROUND

1. Technical Field

The present disclosure relates to an electronic device and a port connector thereof.

2. Description of Related Art

Electronic devices such as digital cameras and others often have a port connector for exchange of data with other devices. Although conventional port connectors satisfy basic requirements, there is still a need for an improved port connector for electronic devices.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Embodiments of the present disclosure are now described in detail, with reference to the accompanying drawings.

Figure 1:
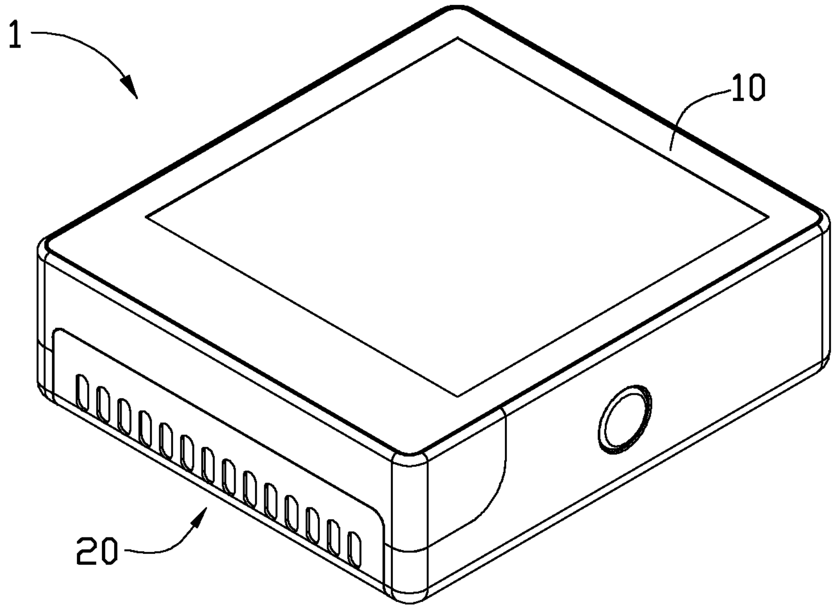
FIG. 1 is an isometric of view of an electronic device according to an exemplary embodiment.
Figure 2:
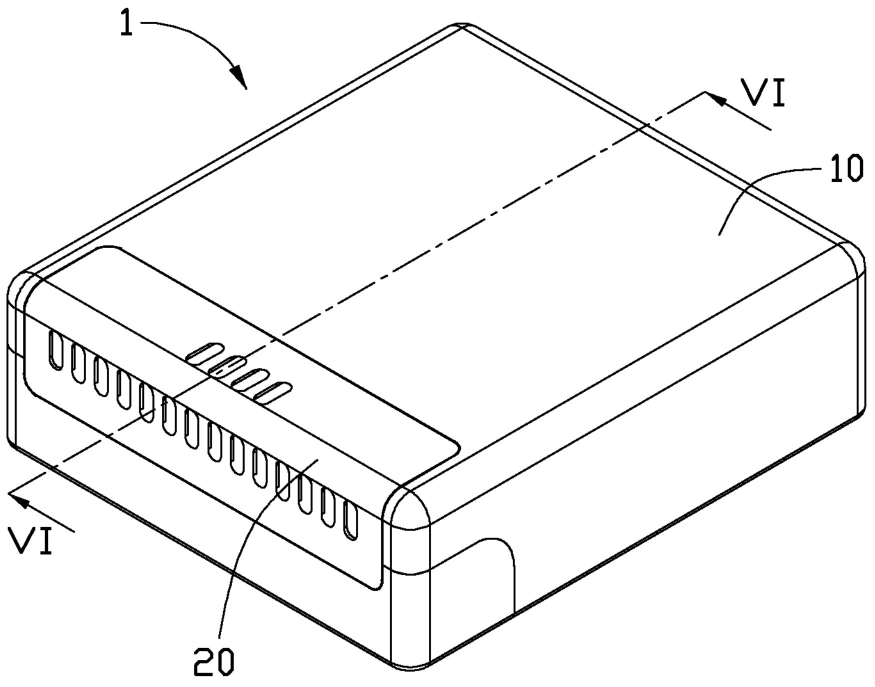
FIG. 2 is an isometric view of the electronic device of FIG. 1, viewed from a reverse perspective.

Referring to FIGS. 1 and 2, an electronic device 1 according to an exemplary embodiment is illustrated. The electronic device 1 includes a main body 10 and a port connector 20 connected to the main body 10. In the embodiment, the electronic device 1 is a watch phone.

Figure 3:
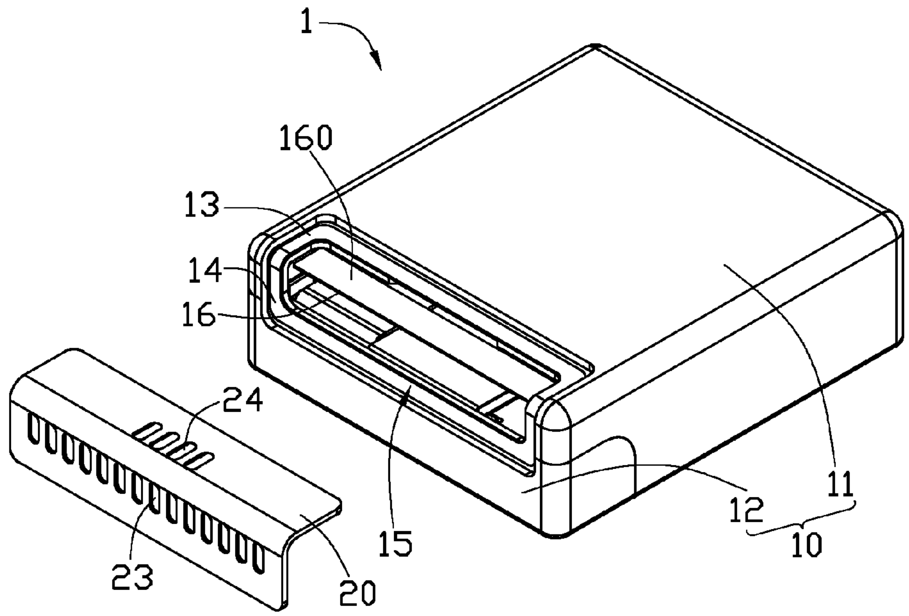
FIG. 3 is an exploded view of the electronic device of FIG. 1.

Referring to FIG. 3, the main body 10 includes a bottom plate 11 and a side plate 12 connected to the bottom plate 11. The bottom plate 11 includes a first support edge 13, and the side plate 12 includes a second support edge 14 adjacent to the first support edge 13. The main body 10 defines an opening 15 extending through both the first support edge 13 and the second support edge 14. The main body 10 further includes a printed circuit board 16 extending parallel to the bottom plate 11. The printed circuit board 16 includes a side surface 160 facing the bottom plate 11.

Figure 4:
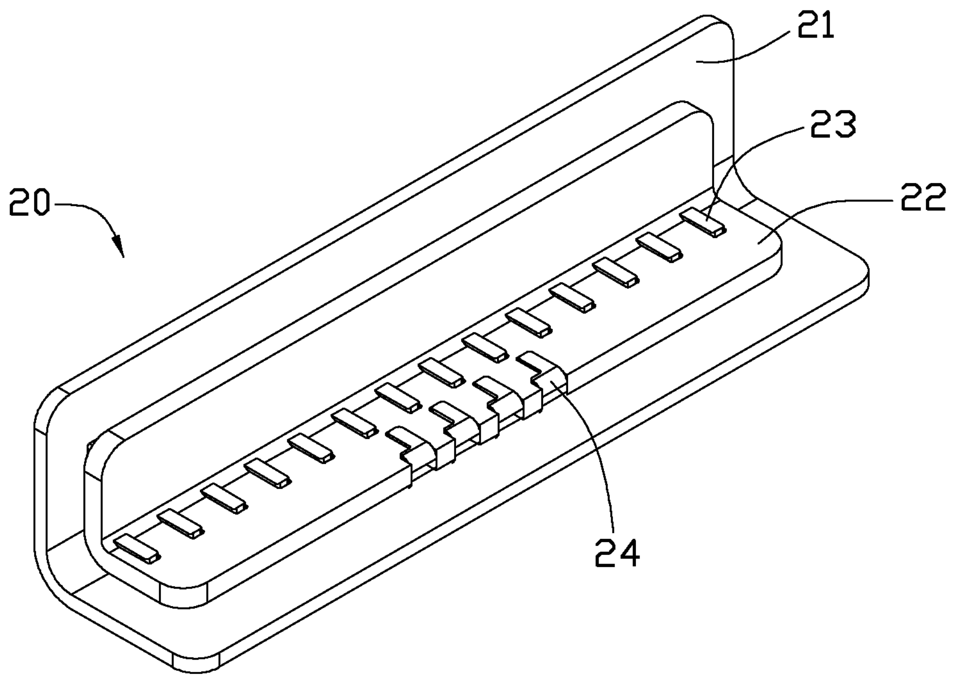
FIG. 4 is an enlarged, isometric view of a port connector of the electronic device of FIG. 1.
Figure 5:
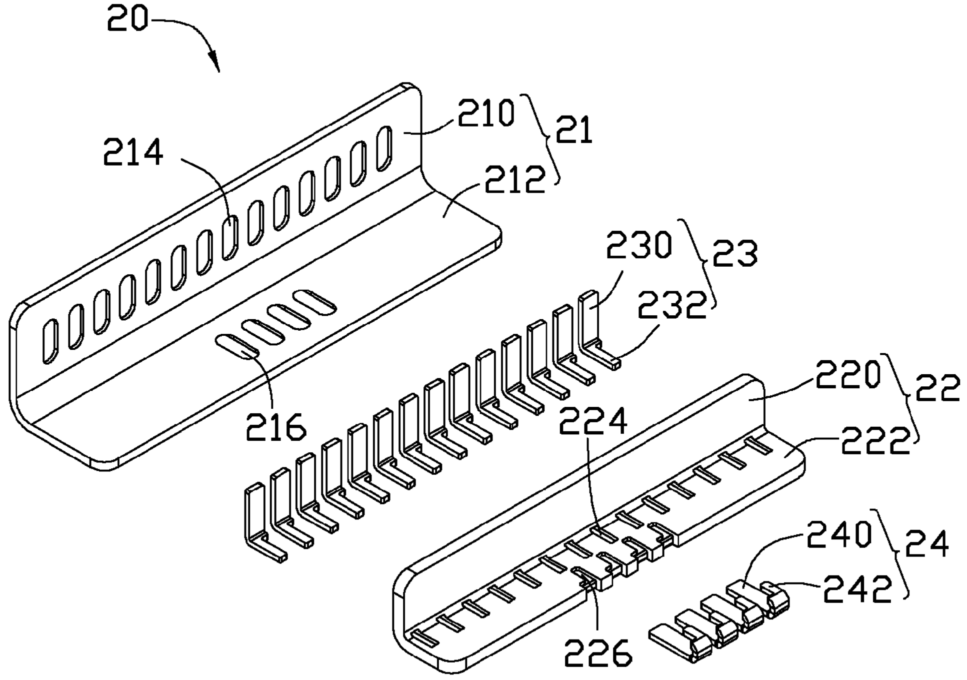
FIG. 5 is an exploded view of the port connector of FIG. 4.

Referring to FIGS. 4 and 5, the port connector 20 includes an outer angled plate 21, an inner angled plate 22, and a number of first pins 23 and second pins 24. The outer angled plate 21 includes a first wall 210 and a second wall 212 connected to each other, forming an angle. The first wall 210 defines a number of first ports 214 extending therethrough. The second wall 212 defines a number of second ports 216 extending therethrough. The inner angled plate 22 includes a third wall 220 attached to the first wall 210 and a fourth wall 222 attached to the second wall 212. The fourth wall 222 defines a number of third ports 224 and fourth ports 226. The third ports 224 are correspondingly aligned with the first ports 212, and the fourth ports 226 are correspondingly aligned with the second ports 216. The first pins 23 and the second pins 24 are made of electrically conductive material. The first pin 23 includes a first tab 230 and a second tab 232 extending perpendicular to each other. The first tab 230 is retained within the first port 214, and the second tab 232 is retained within the third port 224 for contacting the side surface 160 of the printed circuit board 16. The second pin 24 includes a third tab 240 and a fourth tab 242 extending parallel to each other. The third tab 240 is retained within the second port 216, and the fourth tab 242 is retained with the in fourth port 226 for electrically contacting the side surface 160 of the printed circuit board 16.

Figure 6:
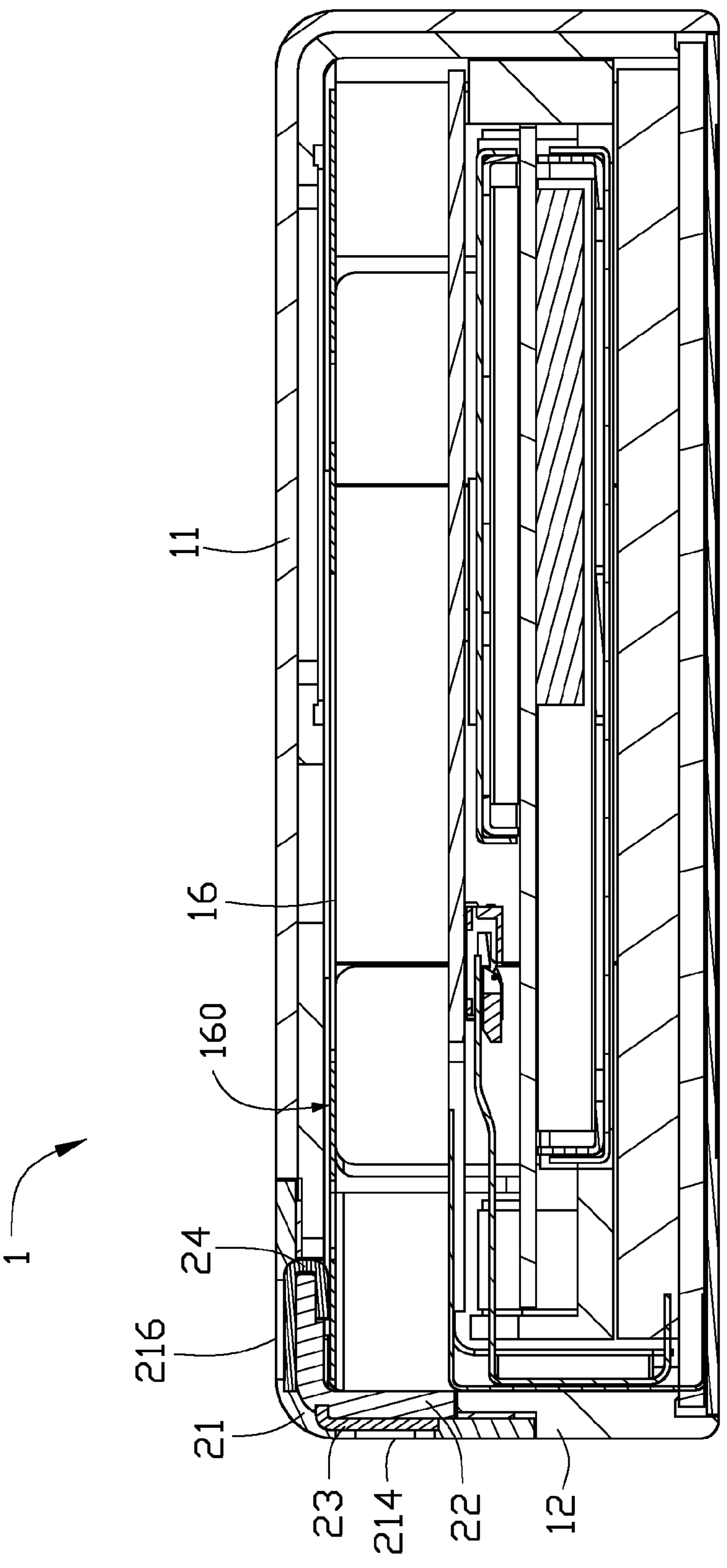
FIG. 6 is a cross-section view of the electronic device taken along the line VI-VI of FIG. 1.

Referring also to FIG. 6, after assembling the port connector 20 to the main body 10, the outer angled plate 21 is attached to the first support edge 13 and the second support edge 14, and the inner angled plate 22 is retained within the opening 15. The first pins 23 and the second pins 24 electrically contact the printed circuit board 16. Thus the electronic device 1 can exchange data with other devices through the port connector 20.

While various embodiments have been described and illustrated, the disclosure is not to be constructed as being limited thereto. Various modifications can be made to the embodiments by those skilled in the art without departing from the true spirit and scope of the disclosure as defined by the appended claims.

What is claimed is:

1. An electronic device comprising:

- a main body comprising a bottom plate, a side plate, and a printed circuit board, wherein the bottom plate and the side plate cooperatively defines an opening, and the printed circuit board is fixed parallelly to the bottom plate; and
- a port connector comprising:
  - an outer angled plate comprising a first wall attached to the bottom plate and a second wall attached to the side plate, wherein the first wall defines a plurality of first ports, the second wall defines a plurality of second ports;
  - a plurality of first pins, wherein each of the first pins is retained within one of the first ports and contacting the printed circuit board;
  - a plurality of second pins, wherein each of the second pins is retained within one of the second ports and contacting the printed circuit board; and
  - an inner angled plate comprising a third wall attached to the first wall and a fourth wall attached to the second wall, wherein the third wall defines a plurality of third ports and fourth ports, each of the third ports is aligned with one of the first ports, and each of the fourth ports is aligned with one of the second ports.

2. The electronic device as described in claim 1, wherein the electronic device is a watch phone.

3. The electronic device as described in claim 1, wherein the bottom plate comprises a first support edge, the side plate comprises a second support edge adjacent to the first edge, the first support and the second support edge cooperatively define the opening therethrough, and the port connector is attached to the first support edge and the second support edge.

4. The electronic device as described in claim 1, wherein each of the first pins includes a first tab and a second tab extending perpendicular to each other, the first tab is retained within the first port, and the second tab is retained within the third port for contacting the printed circuit board.

5. The electronic device as described in claim 1, wherein each of the second pins includes a third tab and a fourth tab extending parallel to each other, the third tab is retained within the second port, and the fourth tab is retained with the in fourth port for contacting the printed circuit board.

6. A port connector to be coupled to an electronic device comprising a printed circuit board, the port connector comprising:

an outer angled plate comprising a first wall and a second wall connected to each other, wherein the first wall defines a plurality of first ports, the second wall defines a plurality of second ports;

a plurality of first pins, wherein each of the first pins is retained within one of the first ports and contacting the printed circuit board;

a plurality of second pins, wherein each of the second pins is retained within one of the second ports and contacting the printed circuit board; and an inner angled plate comprising a third wall attached to the first wall and a fourth wall attached to the second wall, wherein the third wall defines a plurality of third ports and fourth ports, each of the third ports is aligned with one of the first ports, and each of the fourth ports is aligned with one of the second ports.

7. The port connector as described in claim 6, wherein each of the first pins includes a first tab and a second tab extending perpendicular to each other, the first tab is retained within the first port, and the second tab is retained within the third port for contacting the printed circuit board.

8. The port connector as described in claim 6, wherein each of the second pins includes a third tab and a fourth tab extending parallel to each other, the third tab is retained within the second port, and the fourth tab is retained with the in fourth port for contacting the printed circuit board.

9. An electronic device comprising:

a main body comprising a bottom plate and a side plate connected to the bottom plate, the bottom plate and the side plate cooperatively defining an opening therebetween, wherein the bottom plate comprises a first support edge, the side plate comprises a second support edge adjacent to the first edge, and the first support edge and the second support edge cooperatively define the opening;

a printed circuit board fixed parallelly to the bottom plate and comprising a side surface facing the bottom plate; and a port connector attached to the first support edge and the second support edge, and comprising:

an outer angled plate comprising a first wall attached to the bottom plate and a second wall attached to the side plate for covering the opening, the first wall defining a plurality of first ports, and the second wall defining a plurality of second ports;

a plurality of first pins comprising a first tab retained within the first port and a second tab contacting the side surface of the printed circuit board;

a plurality of second pins retained within the second ports and contacting the side surface of the printed circuit board; and an inner angled plate comprising a third wall attached to the first wall and a fourth wall attached to the second wall, the third wall defining a plurality of third ports and fourth ports, each of the third ports being aligned with one of the first ports, and each of the fourth ports being aligned with one of the second ports.

10. The electronic device as described in claim 9, wherein the first tab and the second tab of each first pin are perpendicular to each other, the first tab is retained within one of the first ports, and the second tab is retained within one of the third ports for contacting the printed circuit board.

11. The electronic device as described in claim 9, wherein each of the second pins includes a third tab and a fourth tab that are parallel to each other, the third tab is retained within one of the second ports, and the fourth tab is retained within one of the fourth ports for contacting the printed circuit board.

* * * * *